Figure 1:
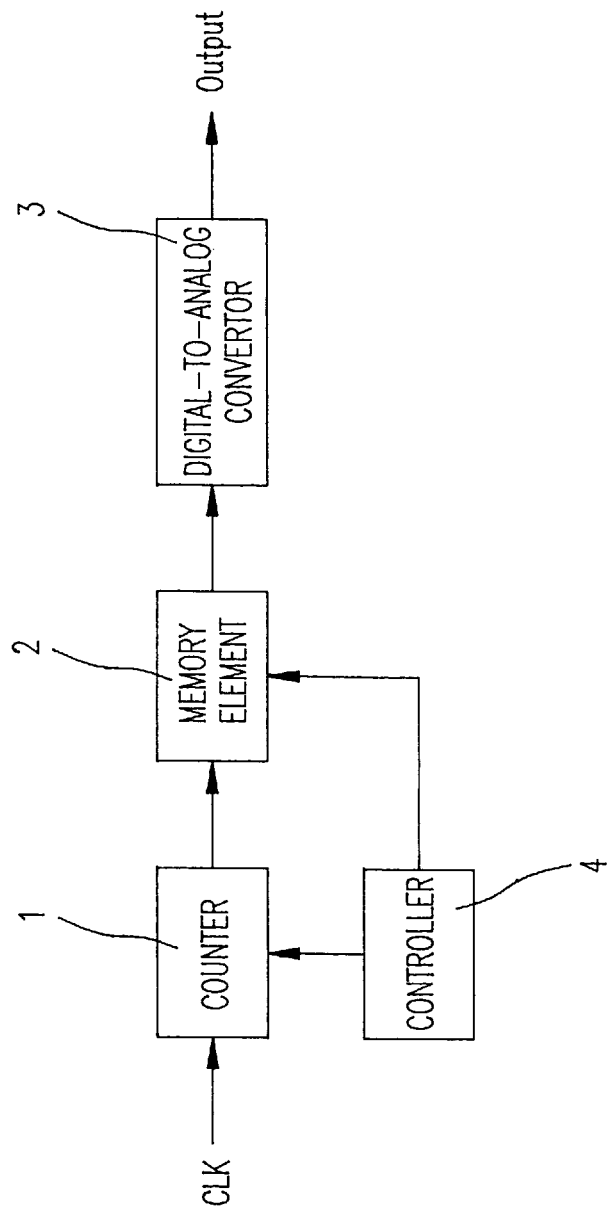

United States Patent

Wu

[11] Patent Number: 5,883,530
[45] Date of Patent: Mar. 16, 1999

[54] METHODS AND DEVICES FOR GENERATING CYCLED WAVEFORMS OF NONSINGLE PERIOD

[75] Inventor: Rong-Tyan Wu, Hsinchu, Taiwan

[73] Assignee: Holtek Microelectronics Inc., Hsinchu, Taiwan

[21] Appl. No.: 786,730

[22] Filed: Jan. 27, 1997

[30] Foreign Application Priority Data

Oct. 8, 1996 [TW] Taiwan ................................. 85112315

[51] Int. Cl.$^6$ .................................................. H03B 21/00
[52] U.S. Cl. .......................... 327/106; 327/107; 711/221
[58] Field of Search .................................. 327/106, 107, 327/129; 711/217, 218, 219, 220, 221

[56] References Cited

U.S. PATENT DOCUMENTS

| | | | |
|---|---|---|---|
| 4,192,007 | 3/1980 | Becker | 327/106 |
| 4,404,644 | 9/1983 | Howie | 327/106 |
| 4,492,936 | 1/1985 | Albarello et al. | 327/107 |
| 5,121,348 | 6/1992 | Dea et al. | 327/106 |
| 5,703,540 | 12/1997 | Gazda et al. | 327/106 |

FOREIGN PATENT DOCUMENTS 276841 5/1996 Taiwan .

Primary Examiner—Timothy P. Callahan
Assistant Examiner—Jung Ho Kim
Attorney, Agent, or Firm—Nims, Howes, Collison, Hansen & Lackert

[57] ABSTRACT

The present invention relates to methods and devices for generating cycled waveforms of nonsingle period, and more particularly to an improvement from the one-way counter used by conventional cycled waveform generator of nonsingle period into an up-down counter or a programmable up-down counter, along with an adder/subtracter. Thus, only the varied values in waveform relative to a DC level have to be filled into a table, and then the varied values in waveform (i.e. the digital waveform sampling values) are input into said adder/subtracter to obtain a periodic digital values by adding/subtracting with a predetermined DC level. Finally, cycled waveforms of nonsingle period are obtained by digital-to-analog converting of said digital values. With the methods and devices of the present invention, not only the fillings in said table can be decreased to reduce the cost, but also the DC output level can be fixed or adjusted arbitrarily for convenient signal processing.

29 Claims, 4 Drawing Sheets

METHODS AND DEVICES FOR GENERATING CYCLED WAVEFORMS OF NONSINGLE PERIOD

FIELD OF THE INVENTION

The present invention relates to methods and devices for generating cycled waveforms of nonsingle period, and more particularly to an improvement of the conventional method and device for generating cycled waveforms of nonsingle period, along with an adder/subtracter. The present invention fills into a table a plurality of or a digital waveform sampling value corresponding to the address output value from an address generating device including an up-down counter or programmable up-down counter, so that said plurality of or a digital waveform sampling value is added/subtracted with a predetermined DC level by an adder/subtracter to obtain a periodic digital value, which will then be converted into a desired analog waveform by a digital-to-analog conversion.

BACKGROUND OF THE INVENTION

It is known that the earliest waveform generating device employed a crystal oscillator as the waveform generating device for the system clock, and this included a programmable frequency divider, counter, multiplexer, controller and digital-to-analog convertor (D/A), as well as various devices and methods for generating a waveform by phase accumulation. The common disadvantage of the prior art is that the manufacturing cost is too high or the relative accuracy is not good enough. Although currently some devices for generating cycled waveforms of nonsingle period are available, which can provide various waveforms of different periods by using a system clock of low frequency, such conventional devices for generating cycled waveforms of nonsingle period employ of actual value filling, i.e. DC signal and AC signal are operated and processed in advance and then filled into said table. The disadvantage of such a method is that the output signal in said table will have no symmetry. Since a symmetrical and periodic signal such as a sine wave will be symmetrical with respect to a DC level, it is not necessary that the value in each cycled period for counting be filled into said table, so that the repeated parts can be deleted to reduce the size of said table. If the output signal is not symmetrical, such an advantage can not be achieved, and also because the DC portion is contained in the output value of said table, it is more troublesome in processing.

SUMMARY OF THE INVENTION

The major object of the present invention is to improve the disadvantages of the prior art, and provide methods and devices for generating cycled waveform of nonsingle period, which can decrease the number of fillings in said table, to reduce cost, and make the DC level fixed or adjusted arbitrarily, so as to simplify processing.

The present invention employs an adder/subtracter, which is used to recover the difference between the sampling value of a corresponding waveform output by said table and a DC level. Furthermore, the table used in the present invention only fills with varied values with respect to a DC level, and then said values will be controlled to output to add/subtract with a DC level. The counter employed is an up-down counter or a programmable up-down counter instead of the conventional one-way counter.

Summing up the above, the present invention relates to a method for generating cycled waveforms of nonsingle period, which comprises the steps of: (a) generating a periodic timing signal for programmable up-down counting in response to the input of a system clock and a control signal, the period of said programmable up-down counting being longer than the period of said waveform to be generated; (b) providing a table for filling with a plurality of digital waveform sampling values; (c) generating an address value in response to said timing signal and an input control signal; (d) reading a corresponding one of said digital waveform sampling values in said table according to said address value; and (e) operating said corresponding one digital waveform sampling value with a predetermined input for generating a periodic digital output signal.

The symmetrical parts of said input waveform can be deleted to reduce the fillings in said table.

The programmable up-down counting in step (a) is done for a timing control signal by a programmable up-down counter.

Said table in step (b) will form a periodic waveform of at least two periods in one counting period of said programmable up-down counter by reading a plurality of digital waveform sampling values stored therein.

If said programmable up-down counting in step (a) utilizes the rising edge or falling edge of said system clock, then the output waveform will be more accurate. If both the rising edge and falling edge are employed, the fillings will be reduced by half.

The cycle number of the output in a programmable up-down counting period is m, m is a positive integer that makes $m \times (f_s/f_o)$ most close to a positive integer or to one half of a positive integer, wherein $f_s$ is the frequency of the system clock, $f_o$ is the output frequency. Of course practically said $m \times (f_s/f_o)$ can be modified into $m \times (f_s/f_o")$, wherein $f_o"$ is a value within the tolerance of $f_o$, $f_o$ is the standard output frequency of the specification, $f_s$ is the frequency of the system clock. Alternatively, the cycle number of the output in a programmable up-down counting period is m, m can be a positive integer that makes $m \times (f_s/f_o')$ an integer or one half of an integer, wherein $f_s$ is the frequency of the system clock, $f_o'$ is the output frequency, $f_o'$ must be consistent with the specification tolerance.

In step (c) and (d), said digital waveform sampling value in said table is sampled according to said corresponding address value.

The operation in step (e) is an adding operation or a subtracting operation performed by an adder/subtracter.

Said adding operation is an operation for adding said digital waveform sampling values taken from said table with said predetermined DC level during one half of said cycled period for counting, said half period can be continuous or discontinuous.

Said subtracting operation is an operation for subtracting said digital waveform sampling values taken from said table with said predetermined DC level during another half of said cycled period for counting, said another half period can be continuous or discontinuous.

Said subtracting operation is an adding operation of 2's complement.

There further comprises a step after step (e), which converts said digital output signal by a digital-to-analog convertor into an analog waveform.

Also, the present invention relates to a method for generating cycled waveforms of nonsingle period, which comprises the steps of: (a) generating a periodic timing signal for up-down counting in response to the input of a system clock, the period of said up-down counting being longer than the period of said waveform to be generated; (b) providing a table for filling with a digital waveform sampling value; (c) generating an address value in response to said timing signal; (d) reading a corresponding one of said digital waveform sampling values in said table according to said address value; and (e) operating said corresponding one digital waveform sampling value with a predetermined input for generating a periodic digital output signal.

The symmetrical parts of said input waveform can be deleted to save the fillings in said table.

The up-down counting in step (a) is done for a timing control signal by an up-down counter.

Said table in step (b) will form a periodic waveform of at least two periods in one counting period of said up-down counter by reading a digital waveform sampling value stored therein.

If said up-down counting in step (a) utilizes the rising edge or falling edge of said system clock, then the output waveform will be more accurate. If both the rising edge and falling edge are employed, the fillings will be reduced by half.

The cycle number of the output in an up-down counting period is m, m is a positive integer that makes $m \times (f_s/f_o)$ most close to a positive integer or to one half of a positive integer, wherein $f_s$ is the frequency of the system clock, $f_o$ is the output frequency. Of course practically said $m \times (f_s/f_o)$ can be modified into $m \times (f_s/f_o")$, wherein $f_o"$ is a value within the tolerance of $f_o$, $f_o$ is the standard output frequency of the specification, $f_s$ is the frequency of the system clock. Alternatively, the cycle number of the output in an up-down counting period is m, m can be a positive integer that makes $m \times (f_s/f_o')$ an integer or one half of an integer, wherein $f_s$ is the frequency of the system clock, $f_o'$ is the output frequency, $f_o'$ must be consistent with the specification tolerance.

In step (c) and (d), said digital waveform sampling value in said table is sampled according to said corresponding address value.

The operation in step (e) is an adding operation or a subtracting operation performed by an adder/subtracter.

Said adding operation is an operation for adding said digital waveform sampling value taken from said table with said predetermined DC level during one half of said cycled period for counting, said half period can be continuous or discontinuous.

Said subtracting operation is an operation for subtracting said digital waveform sampling value taken from said table with said predetermined DC level during another half of said cycled period for counting, said another half period can be continuous or discontinuous.

Said subtracting operation is an adding operation of 2's complement.

There further comprises a step after step (e), which converts said digital output signal by a digital-to-analog convertor into an analog waveform.

The periodic timing signal for said up-down counting can also be used directly as an address or part of an address.

In addition, the present invention relates to a device for generating cycled waveforms of nonsingle period, which comprises a programmable up-down counter for up-down counting periodically to generate an address value; a table for being filled with said address value and reading correspondingly a plurality of digital waveform sampling values filled in said table in advance; a controller for controlling said programmable up-down counter to generate an adequate periodic counting signal to generate an adequate address and controlling said table to output said digital waveform sampling value; and an operator being controlled by an up-counting or down-counting signal of said programmable up-down counter to operate said digital waveform sampling value in said table with a predetermined DC input to obtain a digital output signal.

Said up-down counting period of said programmable up-down counter is longer than the period of the waveform to be generated.

If said programmable up-down counter utilizes the rising edge or the falling edge of said system clock, then the output waveform will be more accurate. If both the rising edge and falling edge are employed, the fillings will be reduced by half.

Said table can be a storage device having the function to output 1's complement or 2's complement.

Said address value is used for reading correspondingly said digital waveform sampling value in said table.

Said table will form a periodic waveform of at least two periods in one counting period of said programmable up-down counter by reading a plurality of digital waveform sampling values stored therein.

Said table is composed of a read only memory and a programmable logic array, or of a random access memory, or of an EPROM, EEPROM, Flash ROM, etc.

The cycle number of the Output in a programmable up-down counting period is m, m is a positive integer that makes $m \times (f_s/f_o)$ most close to a positive integer or to one half of a positive integer, wherein $f_s$ is the frequency of the system clock, $f_o$ is the output frequency. Of course practically said $m \times (f_s/f_o)$ can be modified into $m \times (f_s/f_o")$, wherein $f_o"$ is a value within the tolerance of $f_o$, $f_s$ is the frequency of the system clock, $f_o$ is the standard output frequency of the specification. Alternatively, the cycle number of the output in a programmable up-down counting period is m, m can be a positive integer that makes $m \times (f_s/f_o')$ an integer or one half of an integer, wherein $f_s$ is the frequency of the system clock, $f_o'$ is the output frequency, $f_o'$ must be consistent with the specification tolerance.

Said operator is an adder/subtracter for performing an adding operation or a subtracting operation.

Said subtracting operation is an adding operation of 2's complement.

Said adding operation is an operation for adding said digital waveform sampling values taken from said table with said predetermined DC level during one half of said cycled period for counting, said half period can be continuous or discontinuous.

Said subtracting operation is an operation by subtracting said digital waveform sampling values taken from said table with said predetermined DC level during another half of said cycled period for counting, said another half period can be continuous or discontinuous.

Said digital output signal obtained by operating said operator can be converted by a digital-to-analog convertor into an analog output signal.

Said operator can be an adder/subtracter having the function of converting 1's complement into 2's complement or converting said table output into 1's complement or 2's complement.

The output of said operator is a periodic waveform.

Furthermore, the present invention relates to a device for generating cycled waveforms of nonsingle period, which comprises an up-down counter for up-down counting periodically to generate an address value; a table for filling with said address value and reading correspondingly a digital waveform sampling values filled into said table in advance; and an operator being controlled by said up-down counter so as to operate said digital waveform sampling value in said table with a predetermined DC input for generating a digital output signal.

Said up-down counting period of said up-down counter is longer than the period of the waveform to be generated.

If said up-down counter utilizes the rising edge or falling edge of said system clock, then the output waveform will be more accurate. If both the rising and falling edges are employed, then the fillings will be reduced by half.

Said table can be a storage device having the function to output 1's complement or 2's complement.

Said address value is used for reading correspondingly said digital waveform sampling value in said table.

Said table will form a periodic waveform of at least two periods in one counting period of said up-down counter by reading a digital waveform sampling value stored therein.

Said table is composed of a read only memory and a programmable logic array, or of a random access memory, or of an EPROM, EEPROM, FLASH ROM, etc.

The cycle number of the output in an up-down counting period is m, m is a positive integer that makes $m \times (f_s/f_o)$ most close to a positive integer or to one half of a positive integer, wherein $f_s$ is the frequency of the system clock, $f_o$ is the output frequency. Of course practically said $m \times (f_s/f_o)$ can be modified into $m \times (f_s/f_o")$, wherein $f_o"$ is a value within the tolerance of $f_o$, $f_s$ is the frequency of the system clock, $f_o$ is the standard output frequency of the specification. Alternatively, the cycle number of the output in an up-down counting period is m, m can be a positive integer that makes $m \times (f_s/f_o')$ an integer or one half of an integer, wherein $f_s$ is the frequency of the system clock, $f_o'$ is the output frequency, $f_o'$ must be consistent with the specification tolerance.

Said operator is an adder/subtracter for performing an adding operation or a subtracting operation.

Said subtracting operation is an adding operation of 2's complement.

Said adding operation is an operation for adding said digital waveform sampling value taken from said table with said predetermined DC level during one half of said cycled period for counting, said half period can be continuous or discontinuous.

Said subtracting operation is an operation for subtracting said digital waveform sampling value taken from said table with said predetermined DC level during another half of said cycled period for counting, said another half period can be continuous or discontinuous.

Said digital output signal obtained by operating said operator can be converted by a digital-to-analog convertor into an analog output signal.

Said operator can be an adder/subtracter having the function of converting 1's complement into 2's complement or converting said table output into 1's complement or 2's complement.

The output of said operator is a periodic waveform.

The periodic timing signal for said up-down counting can also be used as an address or part of an address.

BRIEF DESCRIPTIONS OF THE DRAWINGS

Figure 2A:
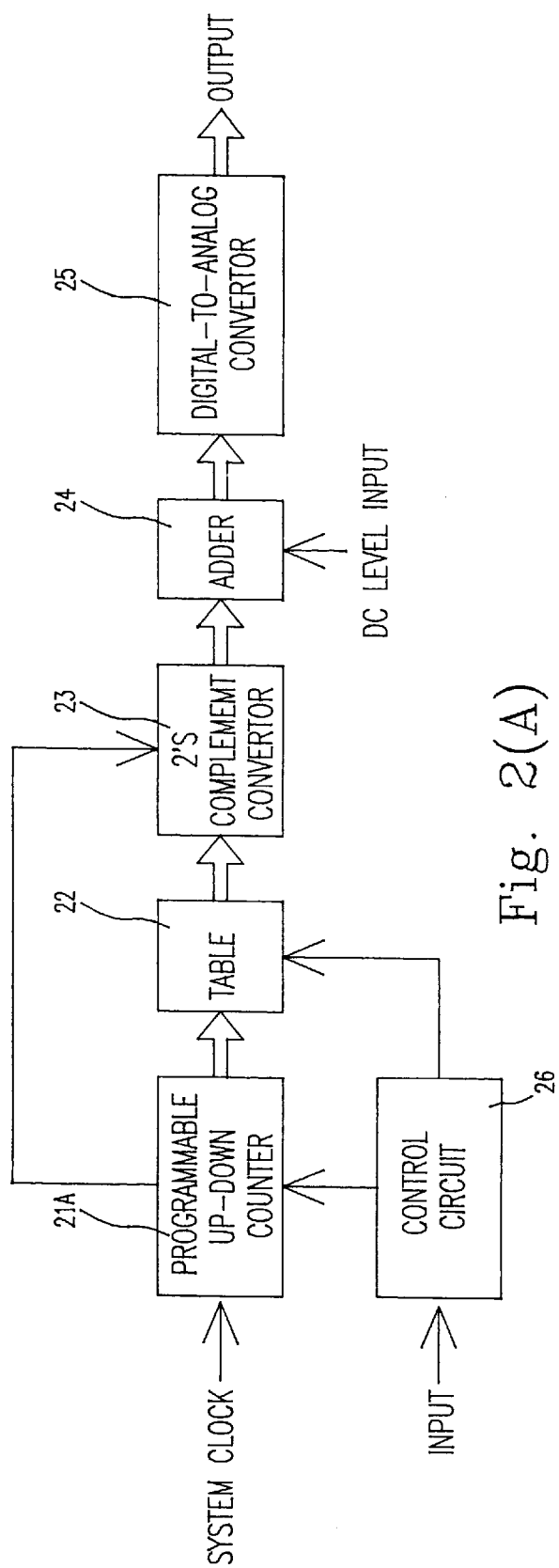
Figure 2B:
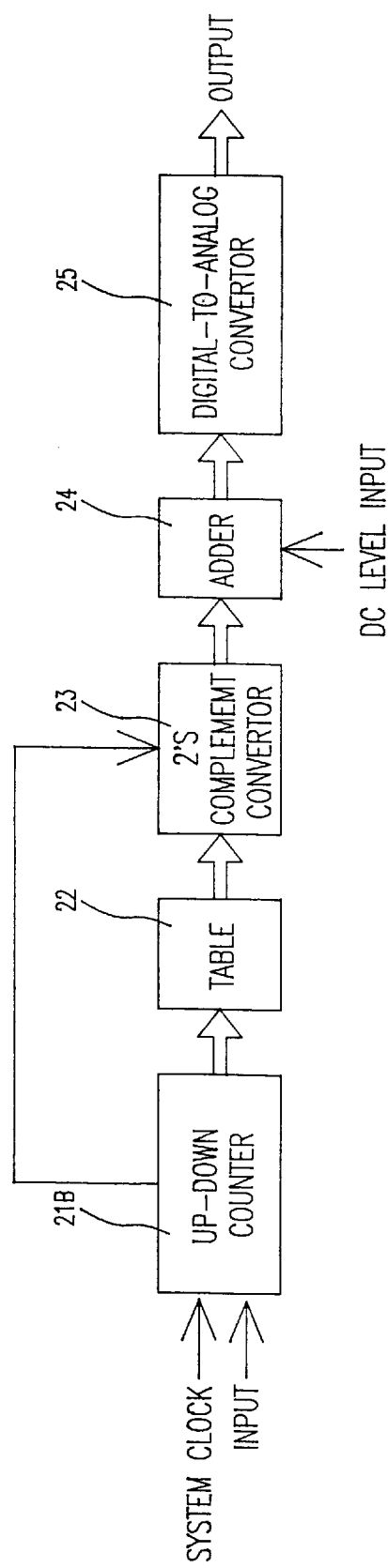
Figure 3A:
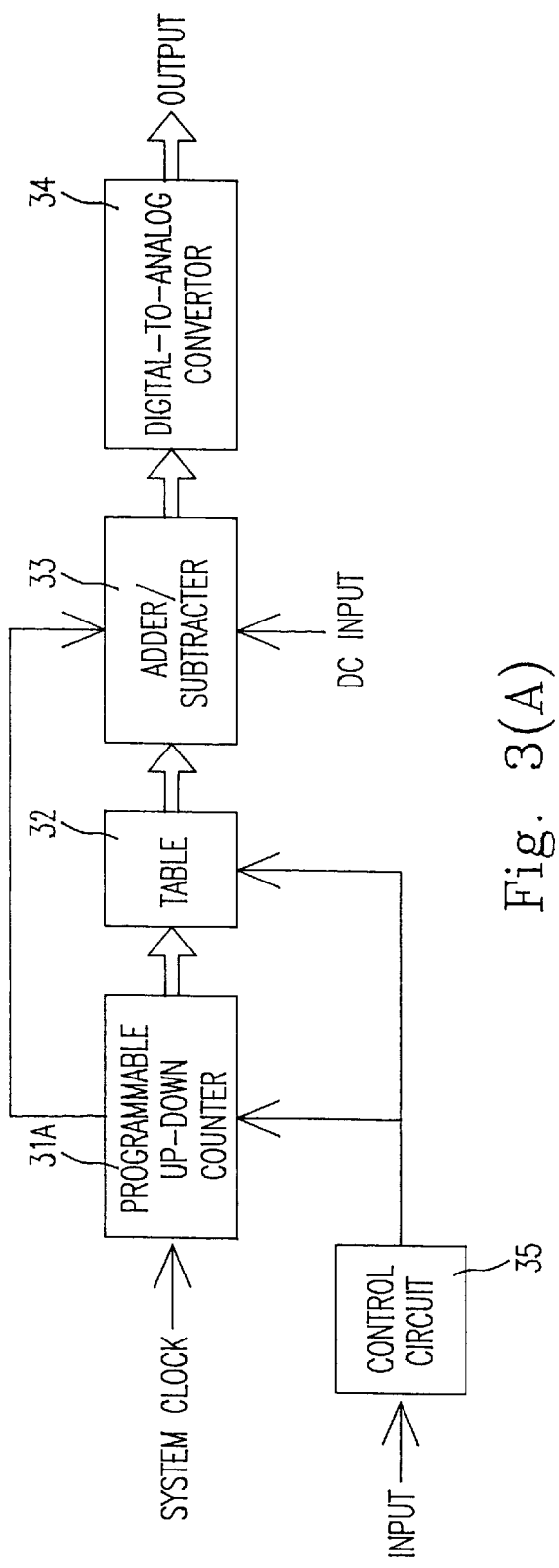
Figure 3B:
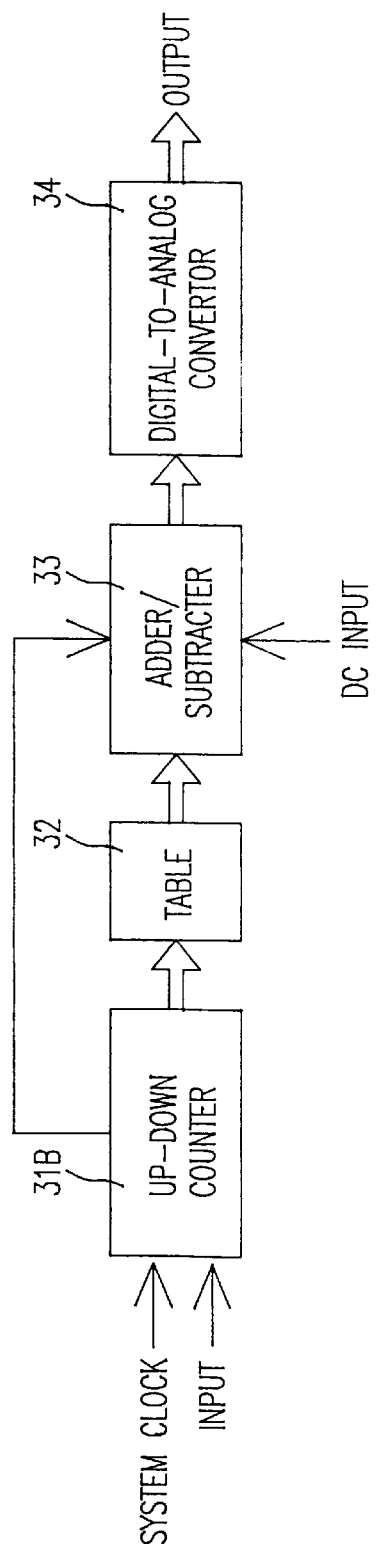
Figure 4:
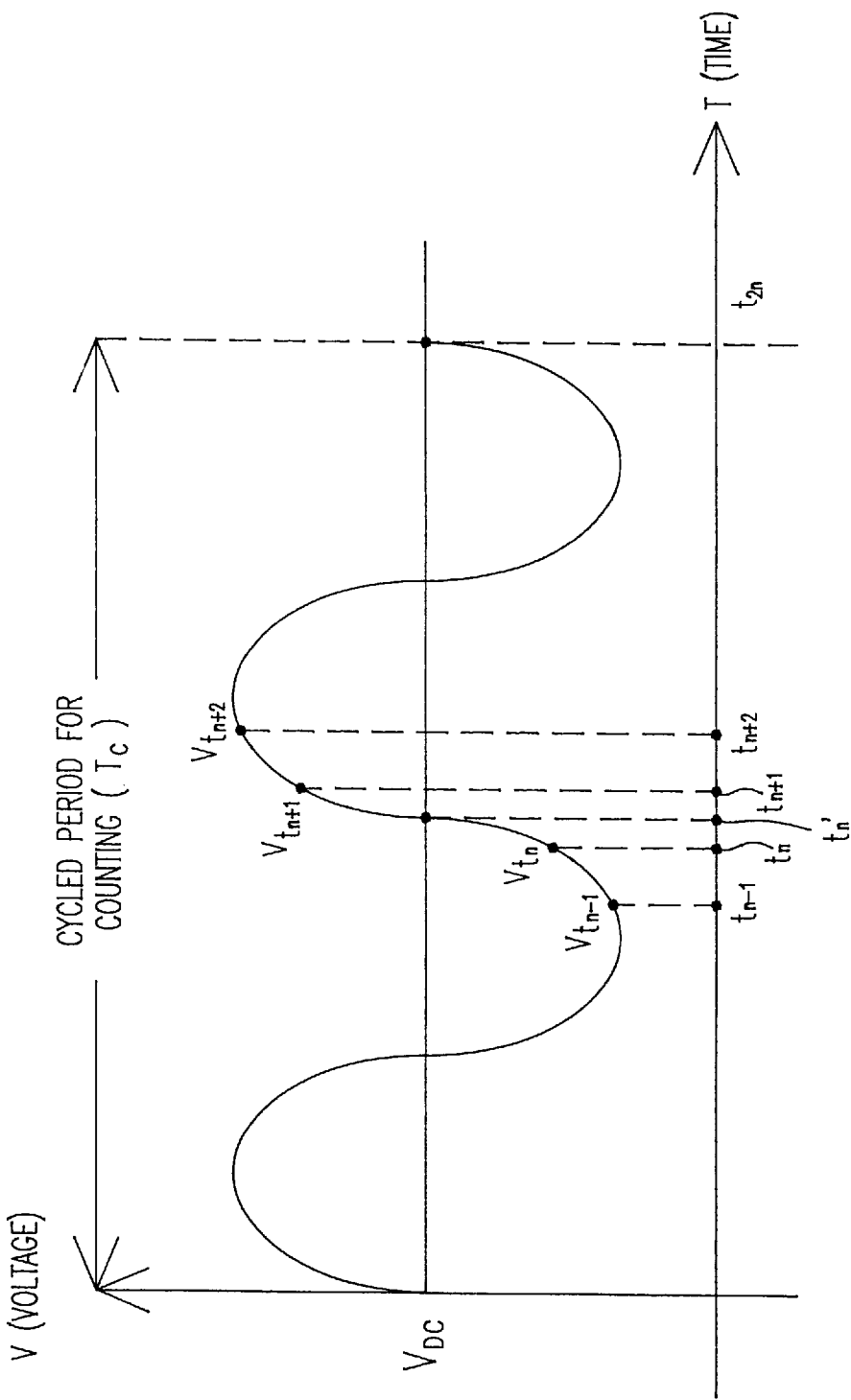

The present invention can be better understood by the detailed descriptions of the following drawings, in which:

FIG. 1 shows a schematic block diagram illustrating the conventional generator circuit of cycled waveforms of nonsingle period;

FIG. 2(A) and FIG. 2(B) show two schematic circuit block diagrams of two embodiments illustrating the generator circuit of the present invention of cycled waveform of nonsingle period;

FIG. 3(A) and FIG. 3(B) show another two schematic circuit block diagrams of two embodiments illustrating the generator circuit of the present invention of cycled waveforms of nonsingle period;

FIG. 4 shows the relationship between the voltage (V) of the sampling value in the present invention of cycled waveforms of nonsingle period and the time (T) of the cycled period for system counting.

DETAILED DESCRIPTIONS OF THE PREFERRED EMBODIMENTS

FIG. 1, is an embodiment known in the art, which has a memory element 2 storing at least a plurality of voltage sampling values of a waveform; a counter 1 electrically connecting with said memory element 2 and receiving input from a system clock, said system clock being a timing basis for counting so as to enable said memory element 2 to output said voltage sampling values sequentially; a controller 4 electrically connecting with said counter 1 and said memory element 2; a digital-to-analog convertor 3 electrically connecting with said memory element 2 for converting said digital voltage sampling values into an analog waveform output.

FIG. 2(A), has a programmable up-down counter 21A for period counting control, a table 22 for storing waveform sampling values, a 2's complement convertor 23, an adder 24, a digital-to-analog convertor 25 for converting from a digital value into an analog waveform output, a control circuit 26 for controlling said programmable up-down counter 21A and said table output. The difference between the present embodiment of FIG. 2(A) and the conventional art of FIG. 1 is the additional adder 24 in FIG. 2(A). Since in conventional binary operation the subtracting operation is by means of the adding operation of 2's complement, the subtracting operation in said adder/subtracter 33 (shown in FIG. 3) of the present invention can be achieved by an adding operation after 2's complement of said table output.

FIG. 2(B), has an up-down counter 21B for period counting control, a table 22 for storing the waveform sampling values, a 2's complement convertor 23, an adder 24, a digital-to-analog convertor 25 for converting from a digital value into an analog waveform output. The difference between the present embodiment of FIG. 2(B) and the conventional art of FIG. 1 is the additional adder 24 in FIG. 2(B). Since the present embodiment of FIG. 2(B) only outputs a cycled waveform of a single frequency, it is not necessary to use a programmable up-down counter, and is also not necessary to use a control circuit to control said up-down counter 21B and the output of said table 22, but output an analog waveform of a single frequency directly. Since in conventional binary operation the subtracting operation is by means of the adding operation of 2's complement, the subtracting operation in said adder/subtracter 33 (shown in FIG. 3) of the present invention can be achieved by an adding operation after 2's complement operation of said table output.

FIG. 3(A), has a programmable up-down counter 31A, a table 32, an adder/subtracter 33, a digital-to-analog convertor 34 and a control circuit 35. The present invention first inputs a system clock to said programmable up-down counter 31A, and according to said system clock said programmable up-down counter 31A outputs an address value corresponding to the digital waveform sampling value in said table 32. Said programmable up-down counter 31A also controls said adder/subtracter 33 to do the adding/subtracting operation of the waveform sampling signal output from said table 32 with a predetermined DC level, and obtains a digital value. Said digital value is then converted into a periodic analog output waveform by a digital-to-analog convertor 34. Furthermore, said control circuit 35 is used to control said programmable up-down counter 31A to generate adequate counting periods and cause said table 32 to output a correct value. However, if only a cycled waveform of a single frequency is output, then it is not necessary to use said programmable up-down counter 31A as well as said control circuit 35. The major difference between the present invention and the conventional art is the additional adder/subtracter 33. As mentioned above, the present invention does not use actual value filling, but by filling with a varied value relative to said predetermined DC level, so as to decrease the number of fillings in said table 32 and reduce the size of said table 32.

FIG. 3(B), has an up-down counter 31B, a table 32, an adder/subtracter 33, a digital-to-analog convertor 34. A system clock is input to said up-down counter 31B, and according to said system clock said up-down counter 31B outputs an address value corresponding to the digital waveform sampling value in said table 32. Said up-down counter 31B also controls said adder/subtracter 33 to do the adding/subtracting operation of the waveform sampling signal from said table 32 with a predetermined DC level to obtain a digital value. Said digital value is then converted into a periodic analog output waveform by a digital-to-analog convertor 34. Moreover, since the present embodiment (FIG. 3(B)) only outputs a periodic waveform of a single frequency,there is no need to use either said programmable up-down counter 31A or said control circuit 35 for controlling said up-down counter 31B and the output of said table 32 (see FIG. 3(A)), as an analog waveform of a single frequency can be directly output. The major difference between the present embodiment and the conventional art is the addition of Said adder/subtracter 33. As mentioned above, the present embodiment does not use actual value filling, but by filling with the varied values relative to said predetermined DC level, so as to decrease the number of fillings in said table 32, and reduce the size of said table 32

FIG. 4, is a graph illustrating the relationship between the voltage of the waveform sampling value in the present invention of cycled waveform of nonsingle period and the time of system counting period. In the prior art, the values of $t_0, t_1, \ldots t_{2n}$ are all filled into said table. However, if we observe $V_m$, with $V_{m+1}$ or $V_{m-1}$ with $V_{m+2}$, we can easily discover that the differences of them with the DC signal $V_{DC}$ are the same, and differs only in sign, i.e. they are symmetrical, therefore only $V_{to} \sim V_m$ have to be filled into the table. In one half counting period, the varied values are taken out from said table to add with said fixed DC level, while in another half counting period the varied value are taken out from said table to subtract with said fixed DC level. As to the reading techniques, the one-way counter is changed into an up-down counter. Referring to FIG. 4 again, if we utilize the rising edge and falling edge of the system clock, then the counting cycle should end at $t_n'$, but due to that the ratio between the positive cycle and the negative cycle of the system clock need not necessarily be 50%: 50%, so it may occur that $t_n' \neq (t_n+t_n-1)/2$, and has some errors. But we can see that the sine wave before $t_n'$ and after $t_n'$ is completely symmetrical with respect to DC signal $V_{DC}$, so it is not necessary to use both the rising edge and the falling edge of the system clock for counting, but only employ the rising edge or the falling edge for counting, so that we can obtain a higher accuracy by the same number of fillings. In addition, suppose that the cycle number of the output generated in a programmable up-down counting period is m, m is a positive integer that makes $m\times(f_s/f_o)$ most close to a positive integer or to one half of a positive integer, wherein $f_s$ is the frequency of the system clock, $f_o$ is the output frequency. Of course practically said $m\times(f_s/f_o)$ can be modified into $m\times(f_s/f_o")$, wherein $f_o"$ is a value within the tolerance of $f_o$, $f_s$ is the frequency of the system clock, $f_o$ is the standard output frequency of the specification. Alternatively, the cycle number of the output in a programmable up-down counting period is m, m can be a positive integer that makes $m\times(f_s/f_o')$ an integer or one half of an integer, wherein $f_s$ is the frequency of the system clock, $f_o'$ is the output frequency, $f_o'$ must be consistent with the specification tolerance. If said output is only a waveform of a single frequency, then said up-down counter is not necessary to be programmable, and is not necessary to use said controller to control said up-down counter and said table, a periodic waveform of a single frequency can be output directly.

The above embodiments can be modified by any skillful person in the art without departing from the spirit and scope of the accompanying claims.

What is claimed is:

1. A method for generating periodic waveforms, comprising the steps of:
   (a) determining a value of a voltage level;
   (b) providing a table filled with differences between a plurality of digital waveform sampling values and said value of said voltage level;
   (c) generating an address value in response to an input control signal;
   (d) reading a corresponding one of said differences in said table according to said address value; and
   (e) adding/subtracting said corresponding one of said differences with/from said value of said voltage level for generating a digital output of said periodic waveforms.

2. The method according to claim 1, wherein said periodic waveforms have symmetrical parts symmetrical to said voltage level.

3. The method according to claim 1, wherein said digital output of said periodic waveforms is generated according to an up-down counting done by an up-down counter in response to the input of a system clock and a control signal.

4. The method according to claim 3, wherein said periodic waveforms have at least two periods in one counting period of said programmable up-down counter.

5. The method according to claim 3, wherein when said programmable up-down counting utilizes the rising edge or falling edge of said system clock, then the output waveform will be more accurate; when both the rising edge and falling edge are employed, the number of said differences filled within said table will be reduced by half.

6. The method according to claim 3, wherein the cycle number of the output in a programmable up-down counting period is m, m is a positive integer that makes $m\times(f_s/f_o)$ most close to a positive integer or to one half of a positive integer, wherein $f_s$ is the frequency of the system clock, $f_o$ is the output frequency.

7. The method according to claim 3, wherein the cycle number of the output in an up-down counting period is m, m is a positive integer that makes m×($f_s$/$f_o$') an integer or half of an integer, wherein $f_s$ is the frequency of the system clock, $f_o$' is the output frequency, $f_o$' is consistent with the specification tolerance.

8. The method according to claim 6, wherein practically said m×($f_s$/$f_o$) is modified into m×($f_s$/$f_o$"), wherein $f_o$" is a value within the tolerance of $f_o$, $f_o$ is the standard output frequency of the specification, $f_s$ is the frequency of the system clock.

9. The method according to claim 1, wherein said step (e) is performed by an adder/subtracter.

10. The method according to claim 3, wherein said voltage level is a DC level, and said corresponding one of said differences taken from said table is added to said DC level during one half of said cycled period for counting, said half period is continuous or discontinuous.

11. The method according to claim 10, wherein said corresponding one of said differences taken from said table is subtracted from said DC level during another half of said cycled period for counting, said another half period is continuous or discontinuous.

12. The method according to claim 1, further comprising a step after step (e), which converts said digital output by a digital-to-analog convertor into an analog waveform.

13. The method according to claim 3, wherein the periodic timing signal for said up-down counting is used directly as an address or part of an address.

14. A device for generating periodic waveforms, comprising:
    an up-down counter for periodically up-down counting;
    a table for being filled therein by a plurality of digital waveform sampling values;
    a controller for controlling said up-down counter to generate an adequate counting signal and controlling said table to output a specific one of said digital waveform sampling values; and
    an operator being controlled by said up-down counter to add/subtract said specific one of said digital waveform sampling values in said table with/from a predetermined DC input to obtain a periodic digital output signal.

15. The device according to claim 14, wherein said up-down counting period of said up-down counter is longer than the period of the waveform to be generated.

16. The device according to claim 14, wherein when said up-down counter utilizes the rising edge or falling edge of said system clock, then the output waveform will be more accurate, when both the rising and falling edges are employed, then the number of said plurality of digital waveform sampling values will be reduced by half.

17. The device according to claim 14, wherein said table will form a periodic waveform of at least two periods in one counting period of said up-down counter by reading said plurality of digital waveform sampling values stored therein.

18. The device according to claim 14, wherein said table is a memory device.

19. The device according to claim 14, wherein the cycle number of the output in a up-down counting period is m, m is a positive integer that makes m×($f_s$/$f_o$) most close to a positive integer or to one half of a positive integer, wherein $f_s$ is the frequency of the system clock, $f_o$ is the output frequency.

20. The device according to claim 19, wherein practically said m×($f_s$/$f_o$) is modified into m×($f_s$/$f_o$"), wherein $f_o$" is a value within the tolerance of $f_o$, $f_s$ is the frequency of the system clock, $f_o$ is the standard output frequency of the specification.

21. The device according to claim 14, wherein the cycle number of the output in a up-down counting period is m, m is a positive integer that makes m×($f_s$/$f_o$') an integer or one half of an integer, wherein $f_s$' is the frequency of the system clock, $f_o$' is the output frequency, $f_o$' is consistent with the specification tolerance.

22. The device according to claim 14, wherein said operator is an adder/subtracter.

23. The device according to claim 14, wherein said operator includes a 2's complement convertor and an adder.

24. The device according to claim 14, wherein said specific one of said digital waveform sampling values taken from said table is added with said predetermined DC level during one half of said up-down counting period, said half period is continuous or discontinuous.

25. The device according to claim 24, wherein said specific one of said digital waveform sampling values taken from said table is subtracted from said predetermined DC level during another half of said up-down counting period, said another half period is continuous or discontinuous.

26. The device according to claim 14, wherein said digital output signal obtained by operating said operator is converted by a digital-to-analog converter into an analog output signal.

27. The device according to claim 14, wherein the periodic timing signal for up-down counting in said up-down counter is used as an address or part of an address.

28. The method according to claim 3, wherein said up-down counter is a programmable up-down counter.

29. The device according to claim 14, wherein said up-down counter is a programmable up-down counter.

* * * * *